(12) United States Patent
Ruckerbauer et al.

(10) Patent No.: US 7,275,189 B2
(45) Date of Patent: Sep. 25, 2007

(54) MEMORY MODULE AND METHOD FOR OPERATING A MEMORY MODULE IN A DATA MEMORY SYSTEM

(75) Inventors: Hermann Ruckerbauer, Moos (DE); Georg Braun, Holzkirchen (DE)

(73) Assignee: Infineon Technologies AG, Munich (DE)

( * ) Notice: Subject to any disclaimer, the term of this patent is extended or adjusted under 35 U.S.C. 154(b) by 472 days.

(21) Appl. No.: 10/724,135

(22) Filed: Dec. 1, 2003

(65) Prior Publication Data
US 2004/0151038 A1    Aug. 5, 2004

(30) Foreign Application Priority Data
Nov. 29, 2002    (DE) ................................ 102 55 872

(51) Int. Cl.
*G11C 29/00*    (2006.01)
(52) U.S. Cl. ....................................... 714/723; 714/763
(58) Field of Classification Search ........ 714/718–719, 714/710, 711; 365/200–201
See application file for complete search history.

(56) References Cited

U.S. PATENT DOCUMENTS

| | | | |
|---|---|---|---|
| 5,541,941 A | | 7/1996 | Dell et al. |
| 6,092,146 A | * | 7/2000 | Dell et al. ....................... 711/5 |
| 6,185,718 B1 | * | 2/2001 | Dell et al. ................... 714/800 |
| 6,421,274 B1 | * | 7/2002 | Yoshimura .............. 365/185.12 |
| 6,791,877 B2 | * | 9/2004 | Miura et al. ........... 365/185.11 |
| 6,832,340 B2 | * | 12/2004 | Larson et al. .................. 714/42 |

OTHER PUBLICATIONS

"Achieving Fault Secureness in Parity Prediction Arithmetic Operators: General Conditions and Implementations" by Nicolaidis et al. in: European Design and Test Conference, 1996. ED&TC 96. Proceedings Publication Date: Mar. 11-14, 1996 pp. 186-193.*
"A Highly Efficient Transparent Online Memory Test" by Thaller in the International Test Conference, 2001 Proceedings Publication Date: 2001 pp. 230-239.*

* cited by examiner

*Primary Examiner*—Cynthia Britt
(74) *Attorney, Agent, or Firm*—Slater & Matsil, L.L.P.

(57) ABSTRACT

Memory modules based on DDR-DRAMs are provided with a buffer and error checking module, which integrates an error data memory and a buffer/redriver functionality for conditioning data signals that are transferred to the memory module and output from the memory module and is suitable for the correction of user data stored erroneously in the DDR-DRAMs. The buffer and error checking module enables the integration of both error correction and buffer/redriver functionality on memory modules within the restricted memory module dimensions in accordance with definitive industry standards, simplified or improved routing of data lines and of control and address lines and also, by virtue of a reduction of erroneously transferred data to the data memory system, an increased real data transfer rate.

18 Claims, 5 Drawing Sheets

MEMORY MODULE AND METHOD FOR OPERATING A MEMORY MODULE IN A DATA MEMORY SYSTEM

TECHNICAL FIELD

The invention relates to a memory module for operation in a data memory system.

BACKGROUND

Modular data memory systems usually have a system board with a plurality of slots for memory modules. The slots are occupied by memory modules in each case depending on the requirements made of the data memory system or on an expansion level of the data memory system.

One example of a data memory system with a modular concept is a computer system (PC, workstation, server) with variable main memory in which slots for memory modules in the form of plug-in sockets are provided on a system board. The memory modules of modular data memory systems are generally present in the form of DIMMs (dual inline memory modules), whose mechanical and electrical interfaces to the system board are subject to industry standards.

In order to increase the performance of such data memory systems, efforts are generally made to increase a clock or data transfer rate. Thus, data transfer rates of 667 Mbits per second and per data signal (Mbit/s/Pin) are provided for DDRII (double data rate) memory systems based on DDR-DRAM modules (double data rate dynamic random access memories) as data memory devices and data transfer rates of up to 1.5 Gbit/s/Pin are provided for DDRIII memory systems. With rising data transfer rates, measures for preserving or improving the signal integrity at high signal frequencies are increasingly gaining in importance.

Known concepts for data memory systems with data transfer rates of up to 1.5 Gbit/s/Pin provide, on the memory modules, branch-free signal lines and distributed capacitive loads for improving the signal integrity.

Equally, buffer/redriver modules are known, which are in each case provided in addition to the data memory devices on the memory modules. The buffer/redriver modules enable, besides a signal conditioning of signals routed to or from the data memory devices of the memory modules, a decoupling of a bus system embodied on the system board from the bus systems respectively formed on the memory modules.

Furthermore, error correction concepts (ECC, error correction codes) are known for data protection purposes. To that end, a first set of redundant data (redundancy data hereinafter) is transferred in parallel with the actual user data, said first set of redundant data in each case being formed from the user data according to known algorithms. The redundancy data are transferred in addition to the respectively corresponding user data for instance to a further data memory device situated on the memory module and are stored. After the user data and the redundancy data have been transferred back to a memory checking module that is generally arranged on the system board, a second set of redundant data (check data hereinafter) is formed there from the user data. Through the comparison of the check data with the redundancy data that are transferred together with the user data, error events are registered and corrected case by case according to known technology. An error event is present in this case if the user data transferred back to the memory checking module deviate from the user data originally transferred from the memory checking module to one of the data memory devices. An error event is based on a transfer error, a defective memory cell in the data memory device or on a change in the data content of a memory cell brought about by ambient influences.

Error correction concepts generally presuppose that a set of redundancy data is stored in addition to each set of user data on the memory modules. In the case of memory concepts such as SDR (single data rate), DDRI and DDRII, the entire data bus usually has 64 data lines routed parallel for transferring the user data. Customary error correction concepts provide a further eight data lines for parallel transfer of the redundancy data. Accordingly, the size of the memory for the redundancy data (error data memory hereinafter) per memory module amounts to an eighth of the user data memory of the memory module.

A further error correction concept, known as Chipkill™, is directed at the detection and correction of multiple errors—undetectable by means of conventional error correction concepts—on a physical data address of a data memory device. In this case, essentially the data bits assigned to the physical data address are allocated (scattering) to a group of parallel bus systems for which a customary error correction concept acts separately in each case. In the case of a defective addressing line within the data memory device, a usually undetectable or uncorrectable multiple error is converted into a number of generally correctable single errors.

Generally, when combining a plurality of measures or concepts which increase the performance of a data memory system, their advantages cumulate.

However, a combination of an error correction concept with a buffer/redriver concept realized using conventional means also leads to disadvantages. Thus, the high space requirement for the buffer/redriver modules and the error data memory makes it extraordinarily difficult to suitably form signal lines (routing) on memory modules whose dimensions are standardized according to JEDEC (joint electronic device engineering council).

Further disadvantages of simply combining error correction concepts on the one hand, and buffer/redriver concepts, on the other hand, occur with different weighting depending on a data bus width of the data memory devices provided on the memory module.

Since the error data memory is advantageously operated identically to the user data memory, the error data memory is usually provided with the same properties as the user data memory. Therefore, as a rule, the same type of data memory device is provided for the user data memory and the error data memory. If the data memory devices for the user data memory have a data bus width of sixteen data lines, then the data memory device for the error data memory typically also has a data bus width of 16 bits. Since customary error correction concepts only utilize 8 bits, however, a data memory of the order of magnitude of an eighth of the entire memory capacity of the memory module disadvantageously remains unutilized.

Furthermore, for cost reasons, corresponding types of memory modules with and without error correction have an essentially identical layout of the signal lines. The corresponding types of memory modules differ merely in the fact that memory modules with error correction are equipped with an additional data memory device as error data memory. A slot for the error data memory device is formed in the same way on the memory modules without error correction, but remains unpopulated.

If the memory module has data memory devices with a data bus width of 8 bits, then it is necessary to provide on two corresponding types of memory modules with an internal 64-bit data bus, by way of example, eight slots for data memory devices for storing the user data and a further slot for a (error) data memory device for storing the redundancy data, that is to say overall an odd number of slots for data memory devices. In a disadvantageous manner, however, no topology for the embodiment of the signal lines between the buffer/redriver module and the data memory devices then permits a symmetrical configuration of the in total nine slots for data memory devices on the memory module. According to a so-called "double T-branch" topology that is customary nowadays, by way of example, the data bus is routed in two branches, one branch of the data bus being connected to four slots, and the second branch to five slots, for data memory devices. This leads to an asymmetrical formation of the data signal lines and the optimization of the timing of the data signals for the two configurations of the memory module with and without error correction is made more difficult. For the data transfer rates provided for DDRII, it would be necessary to introduce additional waiting cycles for data transfer on the control and address bus. However, this leads to an undesirable limitation of the data transfer rate and thus of the performance of the data memory system.

On memory modules which have data memory devices with a data width of 4 bits in each case, at least eighteen data memory devices are required in order to provide a total data bus width of 72 bits. Of these, two data memory devices are provided for storing the redundant data. Memory modules with data memory devices based on a data bus width of 4 bits are provided for applications which require a high amount of memory. Therefore, for this purpose, the data memory devices are also in each case provided with a maximum number of memory cells. The space requirement of the memory cells in a semiconductor substrate of the data memory devices results in a comparatively large device size of the data memory devices used therefor. In this case, corresponding memory modules whose dimensions are restricted to a maximum size of 1.2 inches×5.25 inches in accordance with the definitive industry standard are also covered virtually completely with data memory devices. The arrangement of additional buffer/redriver modules and of an additional error data memory device is not possible in these cases for space reasons.

The memory module 1 illustrated in FIG. 1 has dimensions of 1.2 inches×5.25 inches in accordance with the JEDEC standard. Eight DRAMs 2 as user data memories and one further DRAM 3 as error data memory are provided on at least one of the two placement surfaces of the memory module 1. The memory module 1 has an array of contact devices 10 as an electrical interface to a system board of a data memory system. From the array of contact devices 10, an external data bus 51 and also an external control and address bus 63 are routed to a buffer/redriver module 4. The buffer/redriver module 4 is respectively connected to the DRAMS 2, 3 via data signal lines 5. An internal control and address bus is routed in two branches 61, 62 in each case between the buffer/redriver module 4 and the DRAMs 2, 3.

An asymmetrical loading results for the two branches 61, 62 of the internal control and address bus, since four DRAMs 2 are connected to the first branch 61 and five DRAMs 2, 3 are connected to the second branch 62. In this case, the timing of the respective slower branch 61, 62 of the internal control and address bus prescribes the timing of the entire memory module 1. The timing in the second branch 62 furthermore depends on whether the DRAM 3 is furnished for error data storage purposes. Furthermore, it can be recognized that a routing of the data signal lines 5 is made considerably more difficult by the high population density of the memory module 1.

FIG. 2 indicates a second possibility for arranging the DRAMs 2, 3 on the memory module 1. The problem of an asymmetrical distribution of the capacitive loads on the internal control and address bus 61, 62 and of a timing dependent on the furnishing of the DRAM 3 provided as an error data memory remains in this case.

Thus, for the reasons mentioned above, in the context of industry standards currently in force, a combination of buffer/redriver concepts with error correction concepts that is desirable in order to increase the performance of data memory systems is possible, if at all, only with drastic cutbacks elsewhere.

SUMMARY OF THE INVENTION

The invention is, therefore, based on the object of providing a memory module which enables the intergration of a buffer/redriver functionality and of an error data memory on the memory module. The intergrated buffer and error checking module of the present invention is operable with different bus configurations of the memory module in the context of industry standards in force for the mechanical and electrical interface of the memory module. It is furthermore an object of the invention to provide a method for operating such a memory module.

The invention is explained in more detail below with reference to figures, identical reference symbols being for mutually corresponding components.

DETAILED DESCRIPTION OF ILLUSTRATIVE EMBODIMENTS

The following is a list of reference symbols used herein.

| | |
|---|---|
| 1 | Memory module |
| 10 | Contact devices |
| 2 | Data memory device for user data |
| 3 | Data memory device for redundancy data |
| 4, 4' | Buffer/redriver module |
| 5 | Data lines internal |

-continued

| | |
|---|---|
| 51 | Data lines external |
| 61, 61' | Control and address lines internal |
| 62, 62' | Control and address lines internal |
| 63 | Control and address lines external |
| 7, 7' | Buffer and error checking module |

Figure 1:
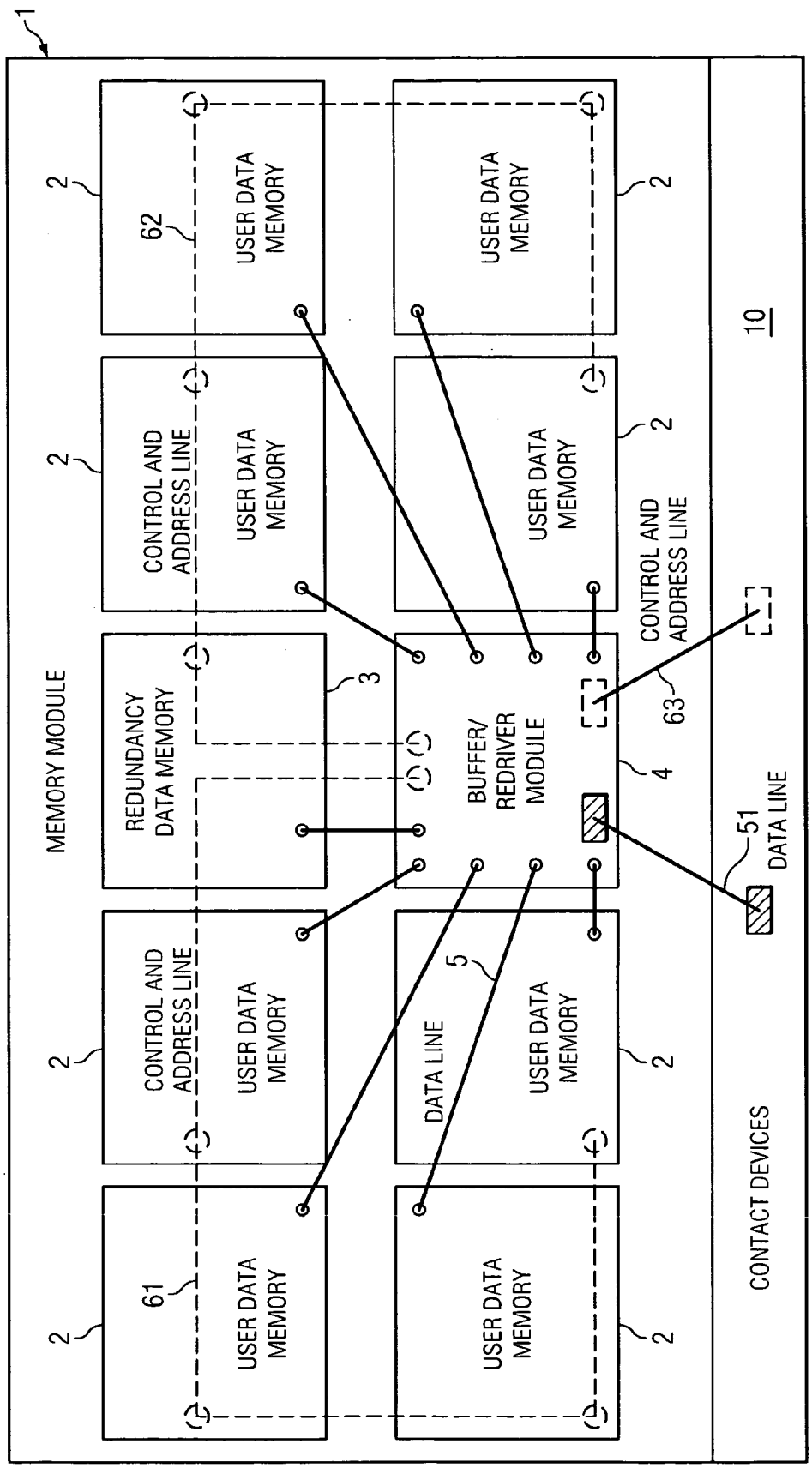
FIG. 1 shows a schematic plan view of a first prior art memory module designed according to a buffer/redriver and error correction concept combined in a conventional manner.
Figure 2:
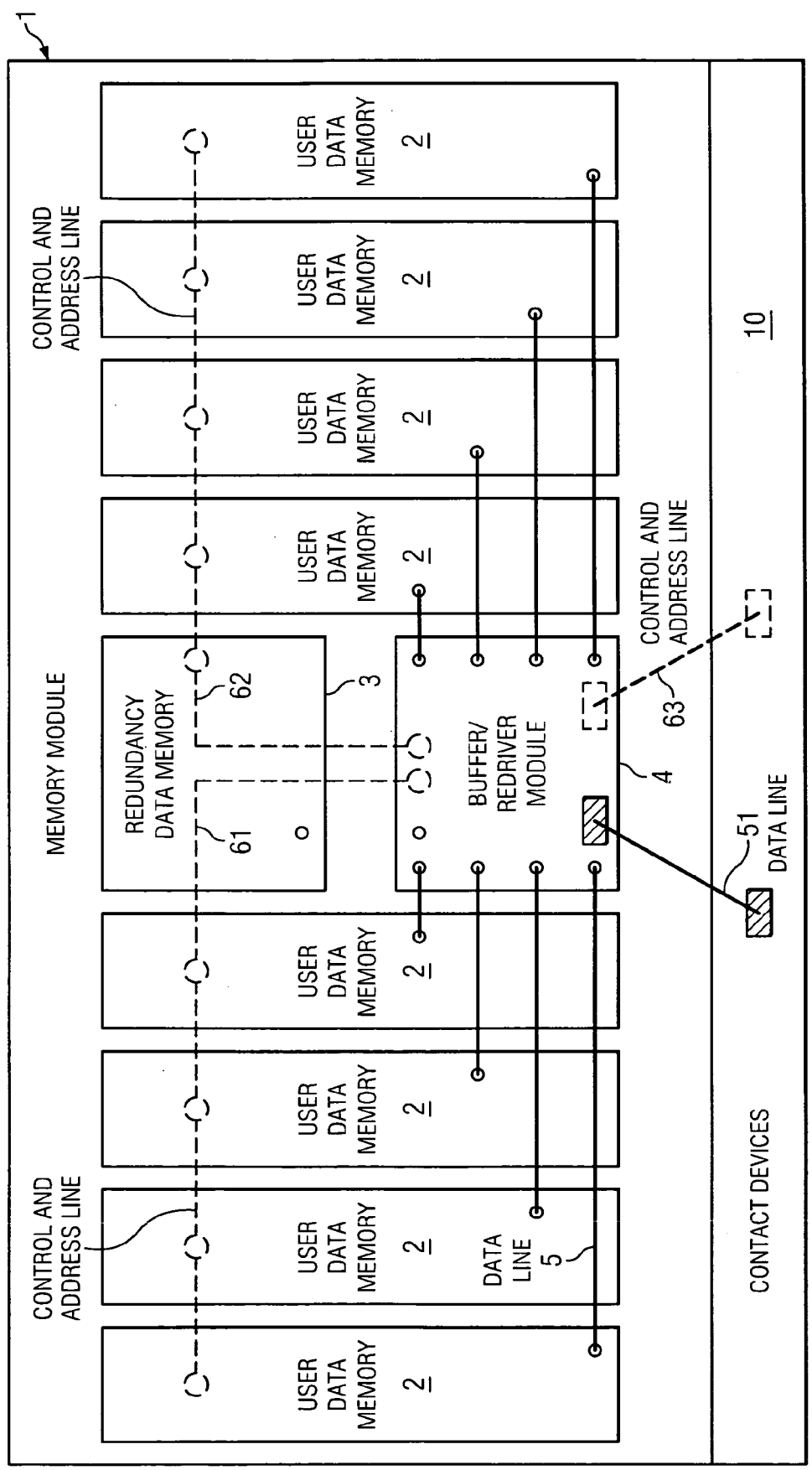
FIG. 2 shows a schematic plan view of a second prior art memory module designed according to a buffer/redriver and error correction concept combined in a conventional manner.
Figure 3:
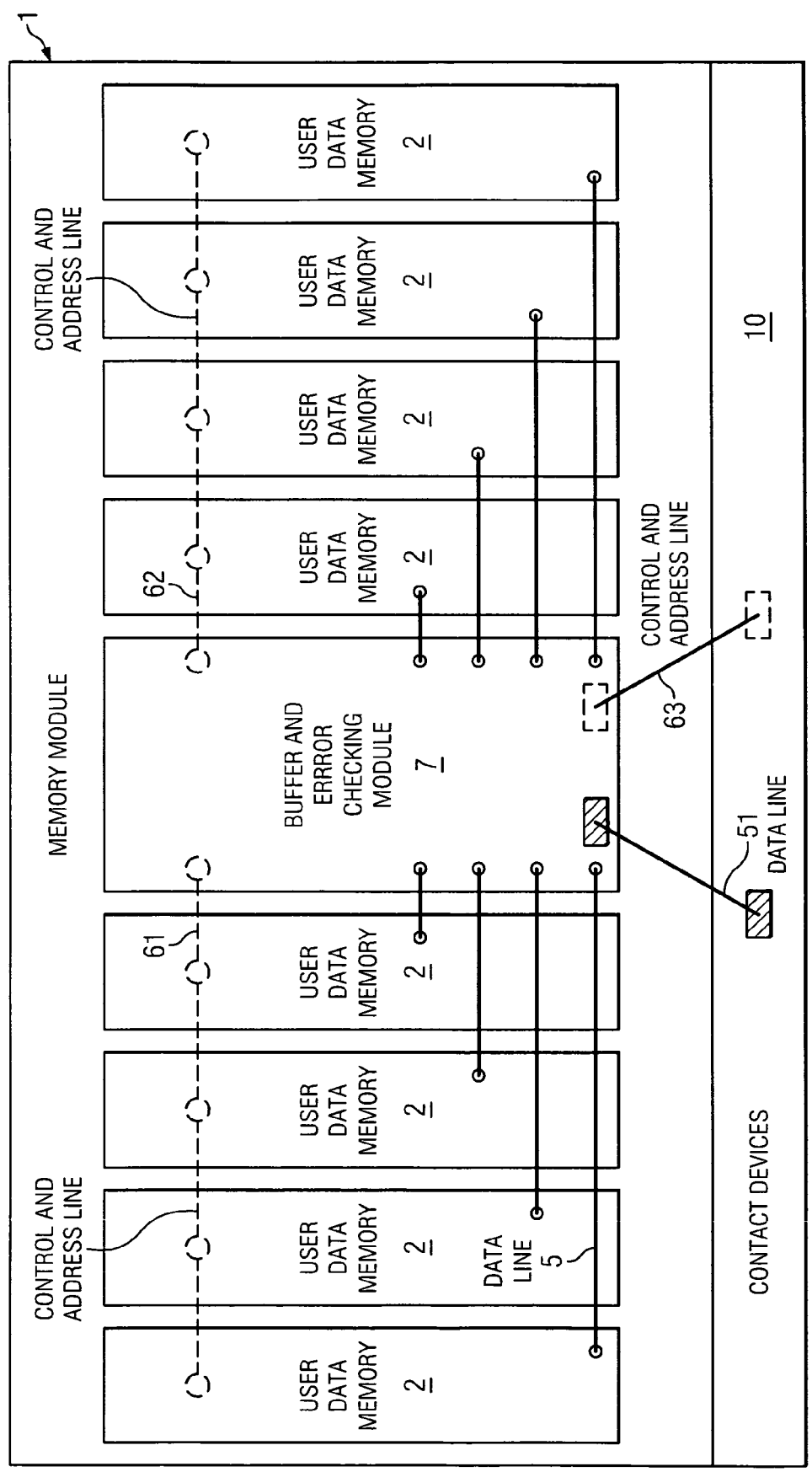
FIG. 3 shows a schematic plan view of a memory module according to the invention in accordance with a first exemplary embodiment.

FIG. 3 illustrates a memory module according to the invention. The routing of data signal lines 5 between the buffer and error checking module 7, which, according to the invention, integrates a buffer/redriver functionality and an error data memory in a common device housing, and the remaining DRAMs 2 for storing the user data is significantly simplified just by the omission of connections to the DRAM 3 for error data storage of FIG. 1 or 2. The same capacitive load is present on each branch 61, 62 of the internal control and address bus. In this case, the capacitive load is independent of whether an error correction is effected on the memory module. The memory module 1 according to the invention can also be operated with error correction with the same data transfer rate with regard to the user data as one of the memory modules in accordance with FIG. 1 and FIG. 2 without error correction.

Figure 4:
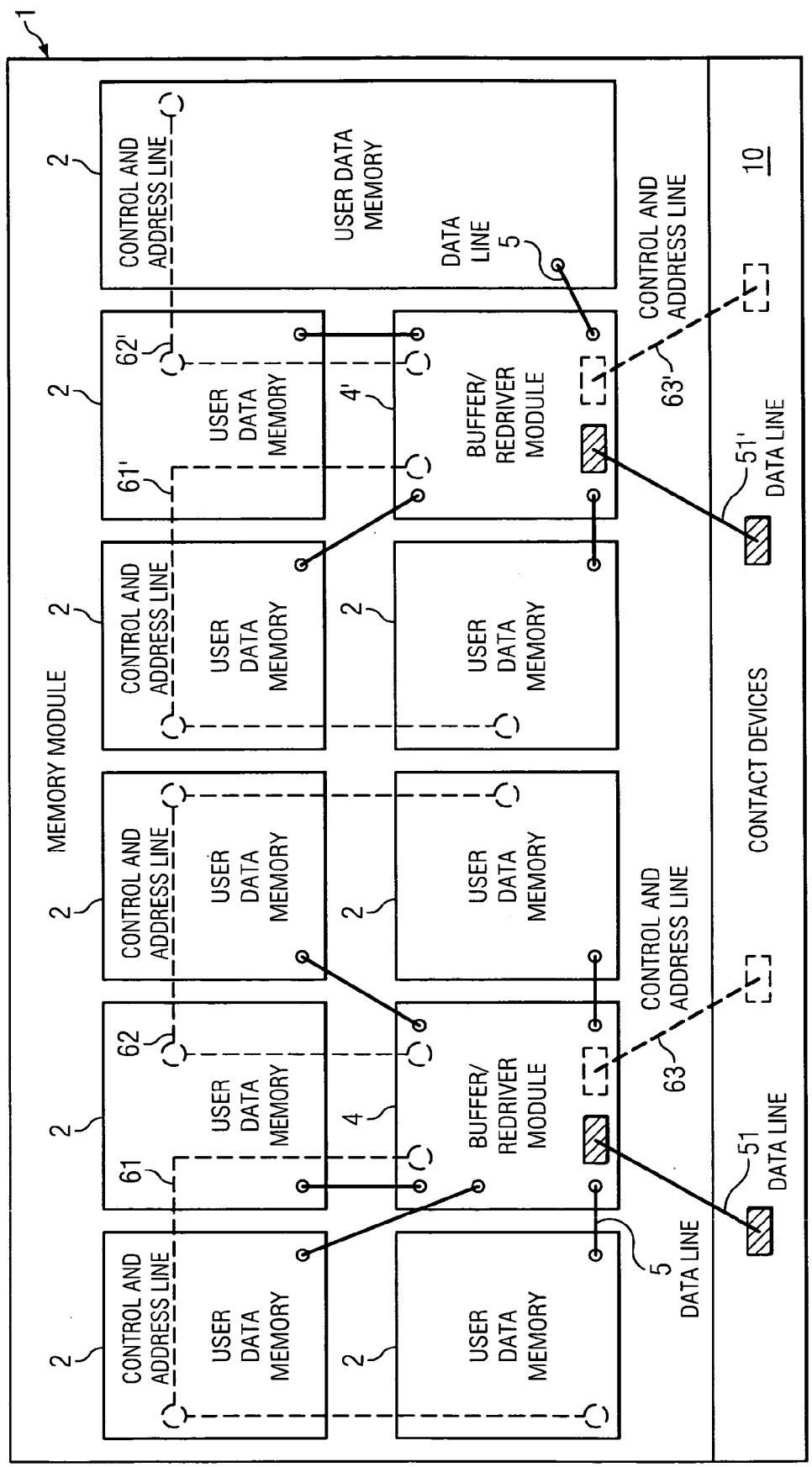
FIG. 4 shows a schematic plan view of a third prior art memory module designed according to a buffer/redriver and error correction concept combined in a conventional manner.

FIG. 4 shows a conventional memory module 1 with two buffer/redriver modules 4, 4'. Here, too, a furnished DRAM 3 for error data storage purposes results in an asymmetrical loading at least in one of the branches 61, 61', 62, 62' of the internal control and address bus system.

Figure 5:
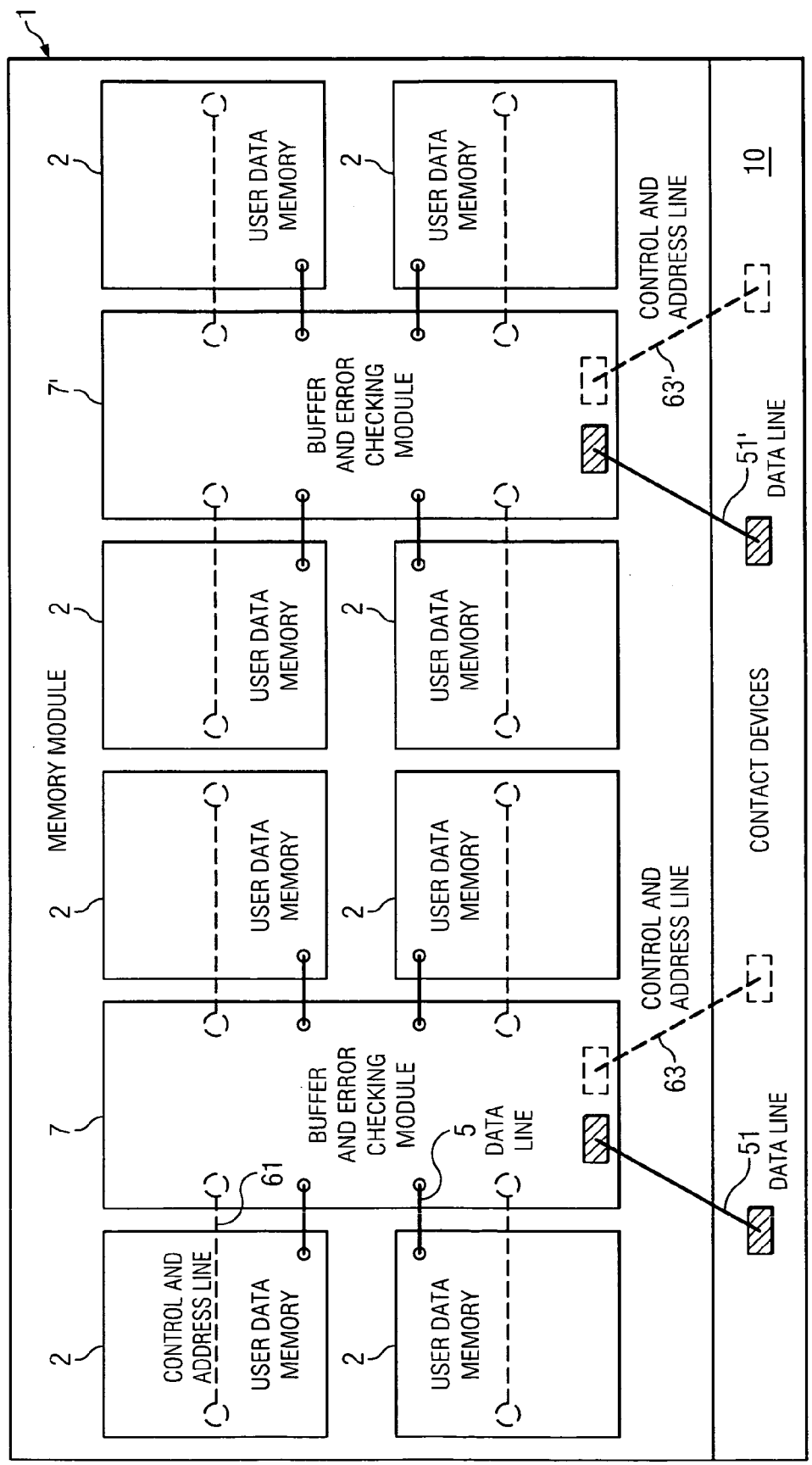
FIG. 5 shows a schematic plan view of a memory module according to the invention in accordance with a second exemplary embodiment.

In FIG. 5, the error data memory is divided between two buffer and error checking modules 7 of the same type. The two buffer and error checking modules 7 in each case furthermore contain a buffer/redriver functionality. The result is a significantly simplified routing of the data signal lines 5 and also a symmetrical loading on all the branches 61 of the control and address bus. The division of the external data bus 51, 51' and of the external control and address bus 63, 63' into two branches in each case results, by comparison with the memory module from FIG. 3, in a simplified routing with regard to the two external bus systems between the combined buffer and error checking modules 7, 7' and the array of contact devices 10.

The memory module according to the invention for incorporation into a data memory system thus has at least one buffer and error checking module, which integrates in each case a buffer device and a data memory device for storing redundancy data within a common device housing.

In this case, the integration of a buffer/redriver functionality and of an error data memory device within a common device housing is based on the consideration that, for DDRII and DDRIII concepts, the dimensions of a buffer/redriver module embodied using customary semiconductor technology is determined essentially by the number of connections of the buffer/redriver module, but not by the buffer/redriver functionality realized in a semiconductor substrate of the buffer/redriver module. In this case, only a small part of the semiconductor substrate of the buffer/redriver modules is utilized by the buffer/redriver functionality.

The disparity between the space requirement for realizing the buffer functionality and the space requirement for embodying the connections results from a buffer functionality that can be realized relatively simply in the semiconductor substrate, on the one hand, and a high number of electrical connections, in particular of data line connections, on the other hand. If only one buffer/redriver module is provided on a memory module, then for a 64-bit data bus system, said buffer/redriver module generally by itself has to be provided with 256 connections for transferring data signals. The number of 256 connections results here from in each case 64 connections for the data bus systems of the system board and of the memory module, and also from the fact that a shielding line generally has to be assigned to each data signal line at data transfer rates of more than 500 MHz/s/pin. For error correction concepts, the number of connections increases in accordance with the width of a redundancy data bus system.

By contrast, on the memory module according to the invention with a combined buffer and error checking module, bus lines between an error data memory device and a buffer/redriver module are obviated. The combined buffer and error checking module advantageously tends rather to have fewer connections than a comparable conventional buffer/redriver module. Furthermore, the functionality of the error data memory can be embodied in the context of conventional technologies, for instance as embedded DRAM, in substantial parts within the otherwise unutilized region of the semiconductor substrate of a buffer/redriver module.

The integration of the error data memory device and of the buffer/redriver functionality within a combined buffer and error checking module thus advantageously reduces the space requirement for a combined buffer/redriver and error correction concept. The space requirement for an integrated buffer and error checking module tends to be smaller than the accumulated space requirement of a customary buffer/redriver module and an error data memory device.

Moreover, the space requirement for a wraparound assigned to each slot on the memory module, said wraparound having to be provided in a manner governed by production as a minimum distance between in each case two modules or data memory devices to be arranged, is also obviated.

The total space saved according to the invention on the memory module enables the arrangement (placement) and the connection (routing) of the required number of data memory devices on the memory module and a simultaneous realization of an error correction concept and a buffer/redriver concept in the context of the memory module dimensions prescribed by industry standards.

Memory modules with larger dimensions are advantageously unnecessary with the memory module according to the invention. Compared with memory modules with larger dimensions, the memory module according to the invention has a higher signal integrity due to shorter line paths. Costs incurred by virtue of a larger area of the memory modules, by virtue of the need for new production apparatuses and, in particular, also by virtue of a changeover of the production or memory modules and data memory systems to a new module size are avoided according to the invention. A new industry standard is unnecessary and a cost-intensive splitting up of production lines is avoided.

According to the invention, the layouts of the signal lines for corresponding types of memory modules with and without error correction do not differ, or differ only to an insignificant extent. The two corresponding types of memory modules with and without error correction merely differ either in the design of the buffer and error checking modules furnished or in the design of one or a small number of signal lines controlling the functionality of the buffer and error checking module. Consequently, each of the buffer and error checking modules, independently of the type of memory module, is always connected to an even number of data memory devices for storing the user data. Symmetrical topologies for the embodiment of the signal lines can thus be found for corresponding types of memory modules with and without error correction. Symmetrical loads in particular on the control and address lines advantageously result.

Thus, the timing in particular of the control and address signals is consequently determined unambiguously for corresponding types of memory modules with and without error correction. Waiting cycles (latencies) between the transfer of control and address signals on the control and address signal lines, on the one hand, and the transfer of data on data signal lines, on the other hand, as are known for instance from DDRI concepts in the operation of memory modules with error correction, are unnecessary. During a write cycle with waiting cycle, the control and address signals are first of all transferred to a buffer memory and are only transferred to the data memory devices in a subsequent cycle together with the data signals output in a manner delayed by one cycle. The waiting cycle significantly reduces the data transfer rate in the data memory system particularly in the case of non-ordered address accesses (random access). Thus, the performance of the memory module is increased according to the invention.

The required size of the error data memory depends only on the memory capacity of the memory module. Therefore, the embodiment of the buffer and error checking module is advantageously largely independent of the data bus width of the data memory devices arranged on the respective memory module.

Since the combined buffer and error checking module is furthermore adapted to the requirements of the memory checking module of the data memory system, the requirement made of the error data memory realized in the buffer and error checking module can advantageously be reduced for instance with regard to the access times compared with the user data memory. The error data memory can thus be designed for example using the embedded technology corresponding to the respective data memory device.

The accompanying decoupling of the number of data bits of the error data memory from the number of data bits of the user data memory proves to be a further advantage. Thus, according to the invention, it is also possible, without the disadvantage of an incompletely utilized or overdimensioned error data memory, to realize for instance error correction concepts with 9-bit redundancy data, which already enable significantly more effective error detection than those with 8-bit redundancy data. In this case, with an error correction concept with 12-bit through to, in the extreme case, the compensation of the failure of complete data memory device is possible by means of the error correction concept.

The buffer and error checking module preferably comprises not only the error data memory but also an error detection and an error correction unit. In conventional systems, the redundancy data (error data, ECC information items) are evaluated in a memory checking module assigned to the memory system. If a data error occurs, then the data error is registered, and if appropriate corrected, in the memory control device. By contrast, according to the invention, possibly erroneous data are already detected on the memory module and corrected case by case. Since significantly fewer erroneous data are consequently transferred between the memory checking module and the memory modules, the data transfer rate of the data memory system is increased further with regard to the user data.

The error correction on the memory module and an additional independent error correction in the memory checking module enable an error analysis of the entire data memory system. This enables an optimization of the bus system between the memory checking module and the memory modules. If the bus system is optimized sufficiently by means of the error analysis, then there is no need for a bus system assigned to the redundancy data between the memory checking module, on the one hand, and the memory modules, on the other hand. According to a particularly preferred embodiment of the memory module according to the invention, said memory module advantageously has no connections for redundancy data lines. The routing of the conductor tracks on a system board of the data memory system, which system board can be populated with the memory modules, is then simplified due to the smaller number of conductor tracks.

A simple conversion of a data memory system without error correction into a data memory system with error correction then also results in a particularly advantageous manner. The conversion is effected without further measures on the further system components of the data memory system solely through the replacement of memory modules without error correction by memory modules with error correction. In this case, the system board corresponds in terms of its design to a system board without error correction devices.

According to a further preferred embodiment of the memory module according to the invention, the memory module has a possibility for signaling a data error. A memory module or a data memory device with accumulated error results can advantageously be identified through an evaluation of the data error in a higher processing plane of the data memory system. Repeatedly defective data memory areas can thus be masked out. The accompanying minimization of the number of error results further increases the performance of the data memory system.

The identification and masking-out of defective memory cells on the memory module is preferably effected in the buffer and error checking module, which then has an error evaluation unit suitable therefor.

All customary memory modules are possible as the data memory device. However, the data memory devices are usually designed as DRAM modules. Data transfer rates for which the advantages of the memory module according to the invention are manifested generally presuppose DRAMs with a DDR interface.

The buffer and error checking module according to the invention for memory modules operated in data memory systems has, besides the required connection devices and a buffer/redriver functionality which is formed in a semiconductor substrate and is suitable for conditioning at least data signals that are transferred to and from the memory module, a memory cell array which is formed in the semiconductor substrate and is operated as an error data memory for memory modules.

In accordance with a particularly preferred embodiment of the buffer and error checking module according to the invention, the buffer and error checking module has an error detection unit. Upon reception of user data from the data memory system, the error detection unit forms a set of redundancy data assigned to the received user data, which set of redundancy data is stored in the memory cell array of the buffer and error checking module. In the case of a subsequent transfer of the user data to the data memory system, a corresponding set of check data is formed in the error detection unit and compared with the assigned redundancy data. The error detection unit registers erroneous user data from the comparison of the stored redundancy data with the corresponding check data.

The buffer and error checking module according to the invention is preferably provided with an error correction unit, which is suitable for correcting the erroneous user data according to known algorithms on the basis of the stored redundancy data and the corresponding check data.

According to a further preferred embodiment, the buffer and error checking module according to the invention has an error signaling unit. Information on the occurrence and on the type of data errors, for instance correctable single-bit errors or uncorrectable double-bit errors, can then be transferred to a further component of the data memory system for error analysis purposes.

Furthermore, it is particularly advantageous to provide the buffer and error checking module according to the invention with an error evaluation unit. The error evaluation unit is suitable for analyzing the data errors that occur on the memory module and for masking out memory cells or memory areas identified as repeatedly defective. The transfer of erroneous user data is thus restricted in a particularly advantageous manner. A data transfer rate of the data memory system referring to the error-free transfer of user data is thus increased further.

The method according to the invention describes the operation of a memory module according to the invention having a plurality of data memory devices for storing user data and a buffer and error checking module in a data memory system. In this case, first of all, user data from a memory control device of the data memory system are received and conditioned by means of the buffer and error checking module on the memory module. Consequently, in the buffer and error checking module, a corresponding set of redundancy data is formed with respect to the user data. Afterward, the user data are stored in the data memory devices and the corresponding set of redundancy data is stored in the buffer and error checking module. During a later transfer of the stored user data from one of the data memory devices to the memory control device, a corresponding set of check data is formed in the buffer and error checking module. Through comparison of respectively corresponding redundancy data and check data, data errors that have occurred in the user data are detected and corrected case by case and, finally, corrected and essentially error-free user data are transferred to the memory control device. The shifting of the error correction to the memory module increases the performance of the data memory system with regard to an error-free transfer of user data.

An error detection and an error correction of data errors that have occurred on the memory modules are thus effected, according to the invention, in the memory modules themselves. Since error events on memory modules generally involve so-called soft errors in DRAM memory cells, or the failure of entire modules, it is possible, first of all, for unnecessary lines or connections for the redundant data bus to be avoided in an advantageous manner on the system board. On the other hand, the performance of the system is also increased since no erroneous data are transferred between the memory modules and the memory checking module. If the system board of a data memory system previously had to be provided with an extended data bus width and be respectively adapted to an error correction concept, the method according to the invention enables simple upgrading of a data memory system just by exchanging memory modules.

According to a particularly preferred embodiment of the method according to the invention, the occurrence of an error event is transferred to at least one further component of the memory system, where a further evaluation of error events is possible. Thus, by way of example, data memory devices or memory modules with a high number of error events are identified. Afterward, the relevant memory area may either be masked out or be provided for exchange.

Memory modules operated according to the invention can be used to optimize data memory systems. In this case, first of all, a redundancy bus system for transferring further redundancy data is provided in precursor systems between the memory checking device and the memory modules. Consequently, an error correction as already described is carried out internally on the memory module. In addition, the consistency of the user data transferred between the memory modules and the memory checking device is checked on the basis of the further redundancy data transferred on the redundancy bus system. It can thus be identified for each error event whether an error source is to be assigned to the memory module or to the bus system of the data memory system. Consequently, the bus system of the data memory system is reworked until only a tolerable number of errors is to be assigned to the bus system.

Follow-up systems of the precursor system are then provided with the optimized bus system and preferably without the then unnecessary redundancy bus system.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A memory module for operation in a data memory system, comprising:
   a plurality of DRAM devices for storing user data; and
   a buffer and error checking module, which integrates in a common device housing:
      a buffer device connected to the DRAM devices via data lines, and serving to condition data signals being transferred on the data lines between the DRAM devices and a memory control device of the data memory system; and
      a DRAM device for storing redundancy data operable to detect and to correct erroneous user data.

2. The memory module of claim 1, wherein the buffer and error checking module is connected to an even number of DRAM devices for storing the user data.

3. The memory module of claim 2, wherein the DRAM devices are arranged symmetrically with respect to the buffer and error checking module.

4. The memory module of claim 1, wherein the buffer and error checking module comprises has an error detecting unit operable,
during a transfer of user data to the memory module, to form and to store the redundancy data; and
during a transfer of user data to the memory control device, to form check data from the user data to be transferred, and also to compare respectively corresponding redundancy data with the check data.

5. The memory module of claim 4, wherein the buffer and error checking module comprises an error correction unit operable to correct erroneous user data on the basis of respectively corresponding redundancy data and check data.

6. The memory module of claim 5, wherein the memory module is absent a contact device assigned to a data line for transferring redundancy data.

7. The memory module of claim 5, wherein the memory module comprises an error signaling unit operable to transfer information on error events to the memory control device.

8. The memory module of claim 5, wherein the buffer and error checking module has an error evaluation unit operable to identify and to mask out defective memory cells in the DRAM devices.

9. The memory module of claim 1, wherein the DRAM devices comprise in each case a DDR interface.

10. The memory module of claim 1, wherein the maximum dimensions of the memory module are about 1.2 inches×5.25 inches.

11. A buffer and error checking module for memory modules, the memory modules comprising in each case a plurality of DRAM devices operated in data memory systems, the buffer and error checking module comprising:
connecting devices;
a buffer/redriver formed in a semiconductor substrate and operable to condition data signals that are transferred to and from the memory modules; and
a memory cell array formed in the semiconductor substrate as an error data memory.

12. The buffer and error checking module of claim 11, further comprising an error detecting unit operable,
during a transfer of user data to the memory module, to form and to store redundancy data and,
during a transfer of user data to a memory control device of the data memory system, to compare the stored redundancy data with check data formed from the data to be transferred.

13. The buffer and error checking module of claim 12, further comprising an error correction unit operable to correct erroneous user data on the basis of respectively corresponding redundancy data and check data.

14. The buffer and error checking module of claim 12, further comprising an error signaling unit operable to transfer information on error events to the data memory system.

15. The buffer and error checking module of claim 12, further comprising an error evaluation unit operable to identify and to mask out defective memory cells in the DRAM devices connected to the buffer and error checking module.

16. A method for operating a memory module having a plurality of DRAM devices for storing data and at least one buffer and error checking module in a data memory system, the method comprising:
receiving data signals of user data transferred to the memory module and conditioning the data signals with the buffer and error checking module;
forming, in the buffer and error checking module, a corresponding set of redundancy data with respect to the user data;
storing the user data in the DRAM devices;
storing the respectively corresponding set of redundancy data in the buffer and error checking module;
forming in the buffer and error checking module, during a transfer of stored user data from the DRAM devices to a memory control device of the data memory system, a corresponding set of check data;
detecting, through a comparison of respectively corresponding redundancy data and check data, data errors that have occurred in the user data and correcting any such errors on a case by case basis; and
transferring corrected user data to the memory control device.

17. The method of claim 16, further comprising signaling an occurrence of a data error in the user data to the memory control device of the data memory system.

18. The method of claim 16, further comprising optimizing a data memory system by:
providing a redundancy bus system for transferring user data and redundancy data in precursor systems on a system board between a memory control device and the memory module;
registering transfer errors in the bus system and analyzing, in the precursor systems, the transfer errors by the memory control device with the aid of the redundancy bus system;
developing, on the basis of an analysis of transfer errors occurring between the memory control device and the memory module, a bus system for transferring the user data of respective precursor systems in a direction of a minimum number of transfer errors; and
providing the data memory system with the bus system developed for a minimum number of transfer errors.

* * * * *

UNITED STATES PATENT AND TRADEMARK OFFICE
CERTIFICATE OF CORRECTION

PATENT NO. : 7,275,189 B2
APPLICATION NO. : 10/724135
DATED : September 25, 2007
INVENTOR(S) : Ruckerbauer et al.

It is certified that error appears in the above-identified patent and that said Letters Patent is hereby corrected as shown below:

In Col. 4, line 31, after "being", insert --used--.
In Col. 7, line 47, after "12-bit", insert --redundancy data, for a user data bus of 64 bits in the case of data memory devices with a data bus width of 8 bits, the compensation of defective addressing lines in the data memory devices--.
In Col. 7, line 48, after "failure of", insert --a--.
In Col. 11, line 2, delete "has".

Signed and Sealed this

Fourth Day of December, 2007

JON W. DUDAS
*Director of the United States Patent and Trademark Office*